United States Patent [19]

Solecki et al.

[11] Patent Number: 6,055,541

[45] Date of Patent: *Apr. 25, 2000

[54] AUTOMATIC REPORT GENERATING SYSTEM

[75] Inventors: Joseph S. Solecki, Pittsburgh; Thomas Shadle, Venetia; Vince Pajerski; Chris Hawkins, both of Canonsburg, all of Pa.

[73] Assignee: SAS IP, Inc., Cheyenne, Wyo.

[*] Notice: This patent issued on a continued prosecution application filed under 37 CFR 1.53(d), and is subject to the twenty year patent term provisions of 35 U.S.C. 154(a)(2).

[21] Appl. No.: 08/933,366

[22] Filed: Sep. 19, 1997

[51] Int. Cl.[7] ................................................ G06F 17/30
[52] U.S. Cl. ............................. 707/103; 707/2; 707/3; 707/10
[58] Field of Search ........................... 707/10, 102, 502, 707/506, 530, 340, 2, 3, 101, 1, 5, 103; 704/9; 395/500

[56] References Cited

U.S. PATENT DOCUMENTS

| | | | |
|---|---|---|---|
| 4,315,309 | 2/1982 | Coli | 705/3 |
| 4,370,707 | 1/1983 | Phillips et al. | 707/104 |
| 4,454,576 | 6/1984 | McInroy et al. | 707/522 |
| 4,860,203 | 8/1989 | Corrigan et al. | 395/705 |
| 5,038,316 | 8/1991 | Hampleman et al. | 707/531 |
| 5,398,183 | 3/1995 | Elliott | 600/509 |
| 5,423,033 | 6/1995 | Yuen | 707/4 |
| 5,444,843 | 8/1995 | Nilsson et al. | 707/502 |
| 5,457,792 | 10/1995 | Virgil et al. | 707/3 |
| 5,539,903 | 7/1996 | Kaplan et al. | 707/103 |
| 5,603,025 | 2/1997 | Tabb et al. | 707/2 |
| 5,619,635 | 4/1997 | Millman et al. | 707/530 |
| 5,694,608 | 12/1997 | Shostak | 707/506 |
| 5,710,918 | 1/1998 | Lagarde et al. | 707/10 |
| 5,721,903 | 2/1998 | Anand et al. | 707/5 |
| 5,732,221 | 3/1998 | Feldon et al. | 707/3 |
| 5,748,973 | 5/1998 | Palmer et al. | 704/9 |
| 5,787,278 | 7/1998 | Barton et al. | 707/1 |
| 5,787,416 | 7/1998 | Tabb et al. | 707/2 |
| 5,802,352 | 9/1998 | Chow et al. | 395/500 |
| 5,809,266 | 9/1998 | Touma et al. | 345/340 |
| 5,832,496 | 11/1998 | Anand et al. | 707/102 |
| 5,852,819 | 12/1998 | Beller | 707/1 |
| 5,870,746 | 2/1999 | Knutson et al. | 707/101 |
| 5,978,787 | 11/1999 | Wong et al. | 707/2 |

*Primary Examiner*—Wayne Amsbury
*Assistant Examiner*—Thuy Pardo
*Attorney, Agent, or Firm*—Throp Reed & Armstrong

[57] ABSTRACT

A system for automatically generating a report from engineering data stored in a database is comprised of a user computer having a browser for requesting an HTML file. A web server generates the requested HTML based on Active Server Pages technology. The ASP file includes script for instantiating a component. The component, a dynamic link library, includes an automation hierarchy. The ASP page includes script for actively generating the report through interaction with the instantiated objects. The HTTP protocol connects the user computer and the web server.

28 Claims, 4 Drawing Sheets

Microfiche Appendix Included
(2 Microfiche, 90 Pages)

AUTOMATIC REPORT GENERATING SYSTEM

Reference is made to an accompanying Microfiche appendix, the total number of microfiche being two (2) and the total number of frames being ninety (90).

BACKGROUND OF THE INVENTION

1. Field of the Invention

The present invention is directed generally to the field of automatic report generating systems and, more particularly, to the automatic generation of a written report and visuals based on engineering data of the type produced by CAD (computer aided design) and CAE (computer aided engineering) software.

2. Description of the Background

Preparing, writing, and publishing reports based on engineering information is a tedious and time-consuming process, usually requiring weeks if not months of engineering time. That problem is particularly acute in the design and analysis of mechanical parts and civil structures where repetitive design and analysis cycles are commonplace.

Typically, the kinds of reports that are available from CAD and CAE programs are based on log files. A log file is a trail of the actions of the software. A report based on a log file provides basic information about what the software did and when. Such a report, however, provides no analysis of the engineering data generated by the program and provides no mechanism for the formatting or delivery of the content.

To produce a report which analyzes the generated engineering data and presents it in a manner that will be understandable to a general audience is a time consuming task. The generated engineering data may be in the form of drawings, numbers, lists, and contour plots, to name a few types of data. To produce an engineering report, the user of the software must author a unique interpretation of the data and compose the report in a separate software system. Lacking a native link between the engineering data and the engineering report, information must be transposed manually. Furthermore, only users with access to and knowledge of the CAD or CAE software can directly collaborate on the design. Thus, the need exists for a report generating system which automatically performs an analysis of engineering data and generates a report that presents that data, and conclusions drawn therefrom, in a manner meaningful to a broad audience and in a form suitable for immediate use and distribution with minimal manual modification or intervention.

SUMMARY OF THE INVENTION

The present invention is believed to be the first engineering report generator in the CAE industry. Using the latest technologies available, reports are generated by the push of a button, delivering HTML documents to the user's desktop for publishing, editing, or archiving. As a fully web-enabled document, the report has unparalleled flexibility and facilitates information sharing across the Internet or an intranet for use by designers, analysisists, managers, and customers. The present invention uses several technologies to accomplish this task. Those technologies include, in one embodiment, the Microsoft Internet Information Server (a web server), Microsoft Active Server Pages (a web server extension), and a VRML viewer, web browser, ActiveX Automation, VB Script, Java Script, and Java.

In one embodiment, the present invention is directed to a system for automatically generating a report from engineering data stored in a database comprised of a user computer having a browser for requesting a web page. A web server generates the HTML page at the time of the request. That is accomplished using an ASP file that includes script for instantiating a component. The component, a dynamic link library (DLL), includes code for instantiating a second DLL for reading values from objects in the database. The ASP file includes script for actively generating the report through interaction with the instantiated objects. An HTTP connection relays information between the browser and the web server.

In addition to the overall system, the present invention is directed to certain components of the system, certain methods carried out by components of the system, and the manner in which the system itself is operated.

The automatic report generating apparatus and method of the present invention provides instant access to up-to-date design and analysis information in a superior form for use and distribution. The present invention significantly reduces engineering time and cost by providing a standardized, in-context, interpretation of design and analysis data. The information appears in a fully formatted document ready to edit, print, or distribute. Because the report focuses on engineering descriptions and not on software operation, the information is meaningful even to individuals who have never used engineering programs such as CAD/CAE software, and is well suited for archiving design information for later reference. By using a web-based delivery mechanism intrinsic to the system, design teams can share the document and supporting illustrations in real-time. The virtual reality system inside the invention allows users on the system to view the shape and response of designs without the need for a specific computer platform and without specialized software. Those and other advantages and benefits of the present invention will become apparent from the Description of the Preferred Embodiments herein below.

BRIEF DESCRIPTION OF THE DRAWINGS

For the present invention to be clearly understood and readily practiced, the present invention will be described in conjunction with the following figures wherein.

DESCRIPTION OF THE PREFERRED EMBODIMENTS

Figure 1:
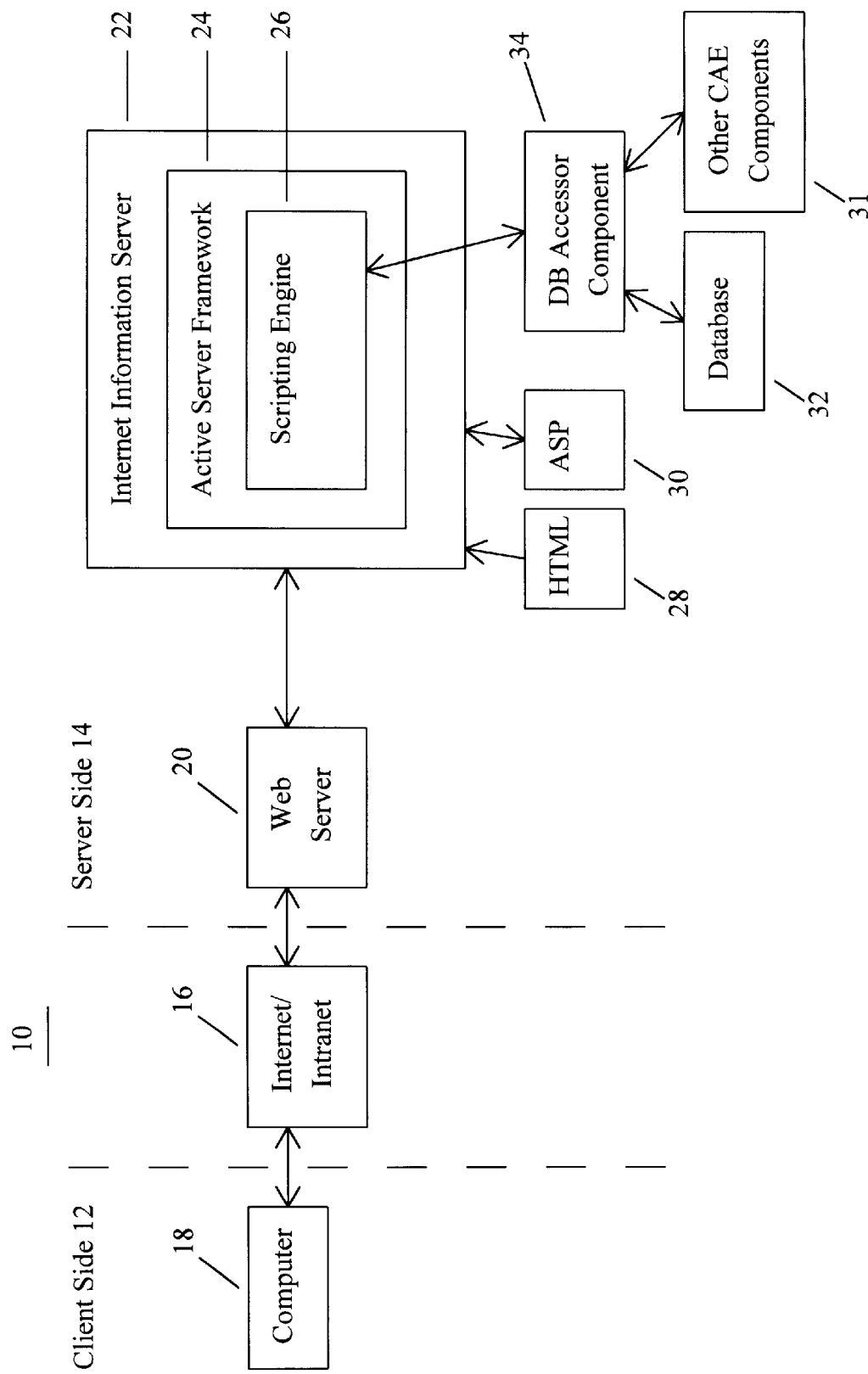
FIG. 1 is a block diagram of a system upon which the present invention may be practiced.

The present invention is directed to a method and apparatus for automatically generating an engineering report from underlying engineering data of the type produced by CAD/CAE programs. The present invention may be implemented on a system 10 of the type illustrated in FIG. 1 which is comprised of a client side 12 and server side 14 interconnected by the world wide web or an intranet 16. The present invention may also be implemented on a stand alone computer. On the client side 12 of the system 10, a computer 18 runs a web browser (not shown). The computer 18 may be any suitable type of computer such as an Apple computer, IBM or IBM compatible computer, UNIX workstation, etc. On the server side 14 of the system 10, a web server 20 is running on an appropriate machine as is known in the art. The web server may be running Microsoft Information Server or Peer Web Service 22 including the Active Server Pages framework 24 incorporating a scripting engine 26 operating therein as shown in FIG. 1. The web server 22 generates HTML files 28 using Active Server Page files 30 in response to requests from the web browser.

The present invention will now be described in the context of a particular CAE product sold by the assignee of the present invention under the name DesignSpace software which is a product currently used in conjunction with Autodesk's Mechanical Desktop or Solid Works CAD software. The invention will also be described using a specific implementation based on Microsoft's Active Server Page (ASP) technology. The description of the present invention in conjunction with those specific products and technology is for purposes of illustration and not limitation. The reader will understand that the concepts underlying the present invention may be applied to any number of CAD/CAE types of programs and may be implemented using other technologies.

System Overview

When a CAE program such as the DesignSpace software is run, attributes for objects are generated or assigned and stored in a database, which is referred to herein as a finite element analysis (FEA) type database (not shown). When the "report" button on the DesignSpace toolbar is activated by the user, the first thing to occur is for a database 32 to be generated. Database 32 is essentially a snapshot of the data in the FEA type database at the time the user decided to generate the report so the results are always "fresh." The present invention may be used without the standalone database 32. The advantage of using a database separate from the FEA type database of the CAD/CAE program is that with the "second" database 32, the report can be accessed without the having to run the CAD/CAE program.

Next, the client side computer 18 makes a request to the web server 20 for an *.asp page. (*.asp is Microsoft's convention for Active Server Page files). The request makes its way to the web server 20. When the web server 20 finds that the requested file is an Active Server Page, the information server 22 invokes the appropriate scripting engine 26 (i.e. VB Script, Java Script etc.). The scripting engine 26 parses the ASP file and executes the script on the server side 14. That is an important feature because it means that no special software is needed on the client side computer 18 to view the report and also that the client side computer 18 can be virtually anything from a Sun workstation to an Intel 486.

As the script is being parsed, it will find a call, e.g., Server.CreateObject(DSDBQuery.DSDBQuery.1), to a specific routine that will create an object. The object created is a DB accessor component 34 which is an Active Server component capable of opening the database 32 and responding to scripting calls for requested information. The DB accessor component 34 runs in the process space of the information server 22 and is separate from the CAD/CAE program. The properties of the objects are read by the information server 22 according to the ASP script and sent downstream to the client side 12 in the form of HTML.

As a result of the architecture of the present invention, the user can instantly view a written report customized to current design information, review key information in easy-to-read summaries, descriptions and tables, quickly determine if design requirements are satisfied, compare the results of complementary or competing design scenarios, jump to any section of the report using web page hyperlinks, customize names, titles, units and numbers in the live report without editing a sentence, print a fully formatted copy of the report, edit the report using a word processor, copy text from the report to paste into another application, share the live report on a local area system (LAN) for instant collaboration with coworkers, and archive the report for future reference.

Additionally, through a VMRL viewer, the present invention provides virtual reality illustrations for visually interpreting the design information. The illustrations show three-dimensional results on the surface of the part, animated shape and response, and clear indications of regions on the surface of the part exceeding design requirements, all through a customizable heads-up-display for controlling the virtual reality world.

The present invention will generate new content each time a report is viewed because of creating a new database 32 every time the report button is activated. Additionally, because the present invention uses standard HTML, the user can use an HTML editor to modify hyperlinks and references inside the report, allowing the addition of web pages to the user's intranet or Internet sites.

At any time, the report and its illustrations can be viewed from inside the CAD/CAE interface using a web browser on the user's desktop or a web browser on a separate computer connected to the user's computer on a local area system (LAN). Reports are always available, even if the CAD/CAE program isn't running. The present invention, when implemented in a system environment, can be implemented using modern Internet software freely available.

Specific Implementation

Figure 2:
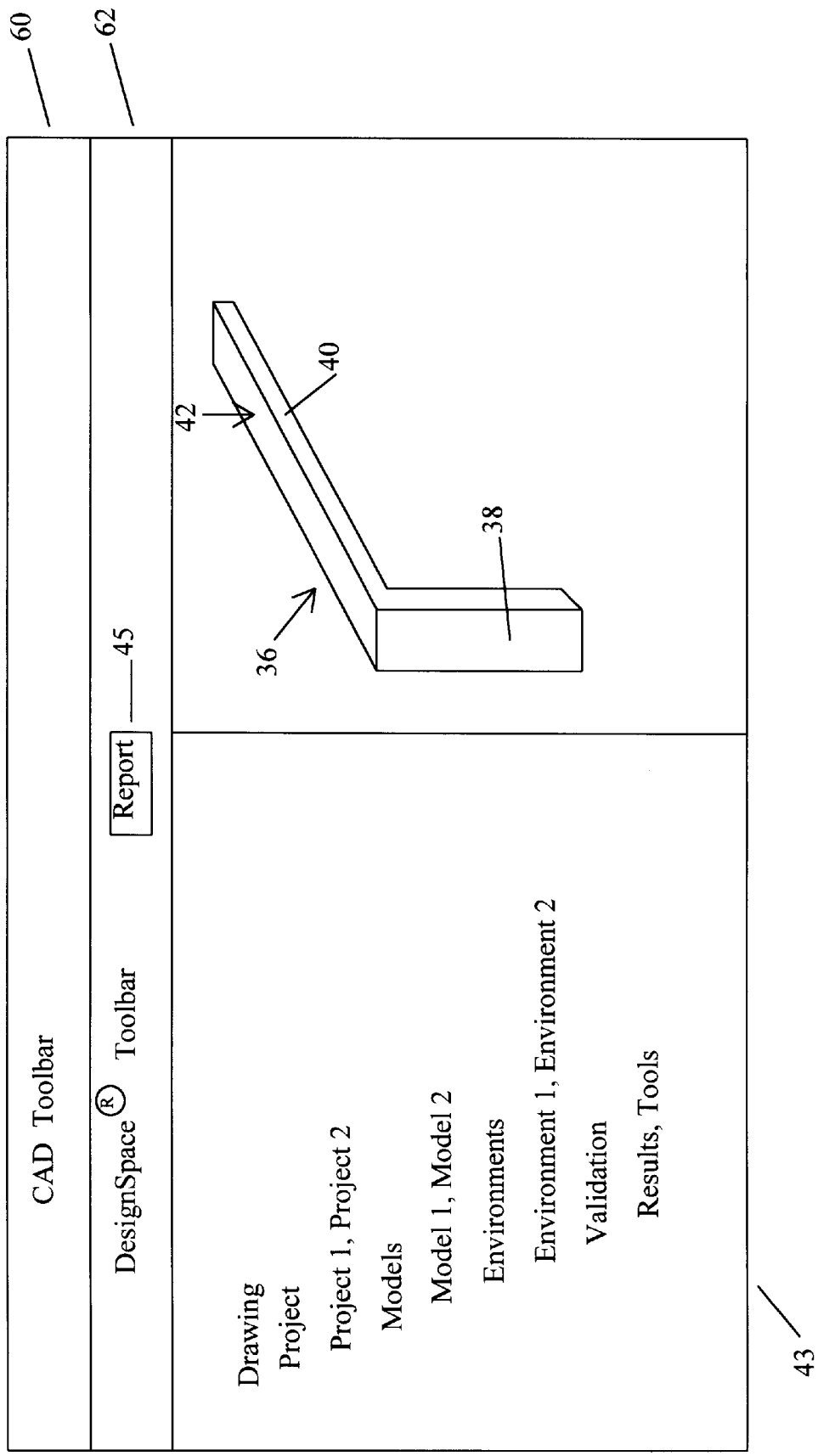
FIG. 2 illustrates a component drawn using a standard CAD program.

For this example, in FIG. 2 we assume that the user is running a CAD program represented by window 60 within which the DesignSpace software can be accessed as shown by window 62. The user may create, using the CAD program, the simple part 36 having a short leg 38 and a long leg 40 as shown in FIG. 2. After the CAD drawn part 36 is completed, the user may access the DesignSpace software. The DesignSpace software enables the user to perform various analyses on the CAD drawn part 36. For example, the part 36 may be defined as being made of steel. Further, the short leg 38 may be defined as being fixed to a wall while the long leg 40 is suspended in air. Finally, a force may be applied to the long leg 40 as shown by the arrow 42. As the user makes selections/decisions using the DesignSpace software, the software creates an object view tree 43 as is known in the art. When all the necessary decisions and parameters are identified, the DesignSpace software will then conduct the selected analyses to determine, for example, if the part 36 will fail, i.e., the stress resulting from the applied force 40 exceeds predefined limits, where the maximum stress will occur, etc.

Figure 3:
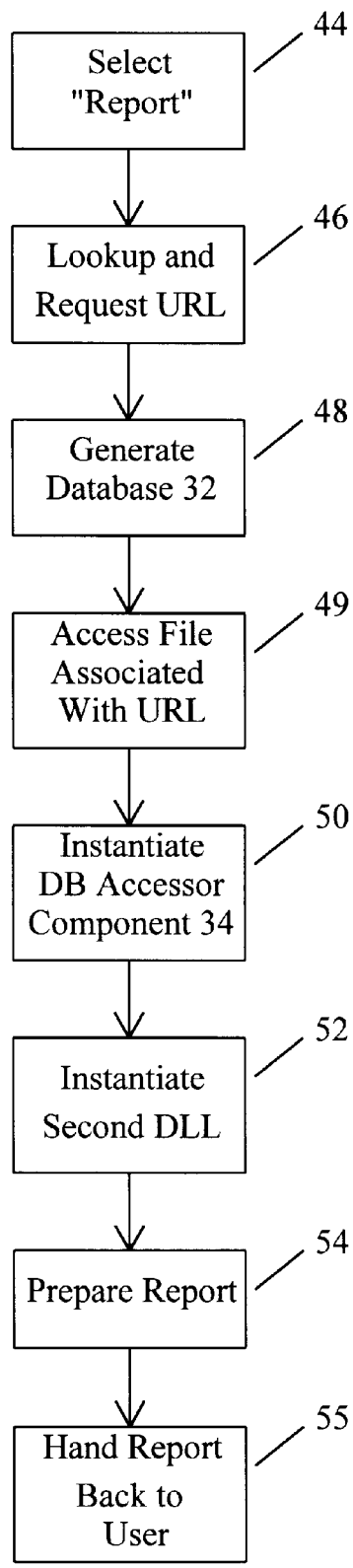
FIG. 3 illustrates the steps of the method carried out by the apparatus (software) of the present invention.

In the DesignSpace software, if the user decides to report on the current project, he goes to the toolbar and clicks on the report button 45 as shown at step 44 in FIG. 3. Several technologies are brought into play. The first is browser technology. In this example, activating the report button 45 really selects the Internet Explorer browser. Behind the report button 45 an ActiveX control embedded in the DesignSpace software.

Once the browser is accessed, it must be given a Uniform Resource Locator (URL). When the user hits the report button 45, the Design Space software GUI looks in a registry at step 46 to find out what URL is used to gain access to the report. A request for that URL is then passed to the web server 20. Steps 44 and 46 are carried out on the client side 12 of the system 10. Software, stored in an appropriate memory device, is used to perform steps 44 and 46.

A sample URL for the DesignSpace report may look like this: http://localhost/designspace/start.asp?prjindex=1&product=SolidWorks The *.asp extension denotes that this file is an Active Server Page (ASP). ASP is an extension of the web server 20 and is capable of dynamically generating web content. Without such a system, the web server 20 in general is limited to delivering only static (prefabricated) content. As a result of using ASP, web server 20 will parse and execute all ASP script before it delivers the file to the requesting client computer 18. That is an important distinction, as previously noted, because the requesting client computer 18 need not have the DesignSpace software or any other special software on his machine to view the material responsive to the URL thereby making the report platform independent. Managers, analysts, and customers are able to view the report regardless of the machine they are using. The only requirement is that the client be equipped with an internet browser.

Figure 4:
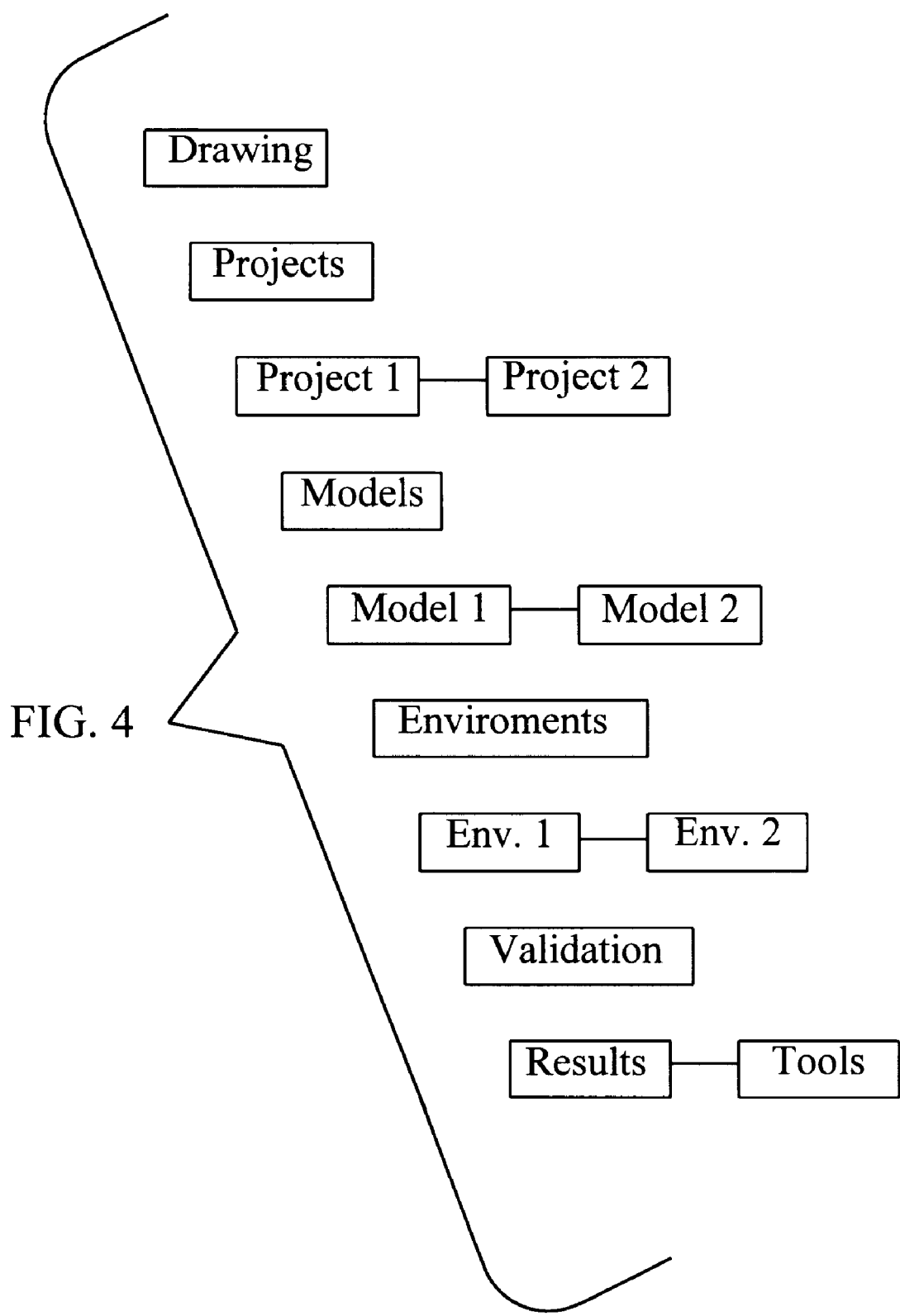
FIG. 4 illustrates a hierarchy of objects in a database.

The next event to take place is that the database 32 is generated at step 48 from the existing DesignSpace database (not shown) and is written to a report directory (which may be named dsreport.dsdb by default). That file is essentially a snapshot of the data at the time the user decided to generate the report so the results are always "fresh." If the user wishes to archive the report he need only rename the database file to another name, otherwise, the database will be overwritten. That was done intentionally to avoid having the report directory overrun with hundreds of DesignSpace database files. The user may archive the report by creating a separate copy of the database. The database 32 is an object oriented database. It uses a flat file structure stored via an I.D. and a type. The tree structure 43 associated with the CAE software is reflected in the database 32 as shown in FIG. 4. At this point we have database 32 and a URL pointing to the start.asp file. At step 49, the file identified by the URL is accessed.

The parameter string in the URL is a list of parameters that are passed on to the web server 20 when the URL is accessed. The question mark marks the start of the parameter list and the ampersand(s) act as delimiters. Thus, from the example above, we can see that two parameters are being passed. The first has the name "prjIndex" with a value of 1 and the second, named "product", has the value "SolidWorks." A list of valid parameter according to one embodiment of the invention is listed below in table 1.

TABLE 1

| | |
|---|---|
| Product | Required. Specifies the host CAD system used with DesignSpace. "Autodesk" if Mechanical Desktop was used "SolidWorks" if SolidWorks was used |
| prjindex | Required. Specifies which project to report on. For example, if the report covers the second project, the URL contain "prjIndex=2." The default is 1, corresponding to the first project the drawing object in the DesignSpace Explorer Object View tree |
| filename | Optional. Specifies the report database file. "dsreport.dsdb" displays the last report shown in Report View in the DesignSpace Explorer (default) the name of a copied .dsdb file. Copying dsreport.dsdb to another name with the extension (".dsdb") allows you to archive multiple reports on your system. |

TABLE 1-continued

| | |
|---|---|
| Unitsys | Optional. Overrides the unit system selection in the Options page. Used to synchronized system between Object View and Report View. "1" for SI Metric (m, kg, Pa, s) "2" for Metric (cm, g, dyne$^2$, s) "3" for Metric (mm, kg, Mpa, s) "4" for U.S. Customary (ft, lbm, psf, s) "5" for U.S. Customary (in, lbm, psi, s) |
| vrml | Optional Specifies where to display VRML illustrations. "window" to display VRML illustrations in a new small window (default in standard web browsers) "frame" replaces the right frame of the report with VRML (default in the DesignSpace Explorer). You can return to the report by clicking Back or by clicking a link in the Contents frame. |

These parameters, and any others, are used in the script of the ASP files 30 to initialize the DB accessor component 34. Initialization of the DB accessor component 34 involves the instantiation of a first dynamic link library (DLL). The DB accessor component 34 is a library of objects corresponding to the objects found in the database 32.

The first of two DLL's loaded by the script on the ASP page 30 is loaded, in this example, at step 50, with a call to Server.CreateObject(DSDBQuery.DSDBQuery.1). The first DLL (DSDBAccessor.DLL) contains all of the Automation wrappers for accessing attributes for objects in the database 32. The objects themselves are found in component 31 while the attributes are found in database 32. As previously stated, the first DLL is the DB accessor component 34 and is instantiated in the process of the information server 22. The Automation hierarchy (FIG. 4) is exposed to the user in a way that is already familiar because it mimics the DesignSpace Explorer object tree view 43 as shown in FIG. 2. Each of the items identified in FIG. 4 is an object.

When the DB accessor component 34 is initialized, it instantiates a second DLL at step 52 named DSWebCAL.DLL. The second DLL is responsible for instantiating the rest of the components necessary for reading and accessing the database objects contained in the database 32. After the initialization of the two DLL's, it is then possible to access all exposed database objects using any scripting language that is Automation enabled. Thus, any scripting language may be used to generate a report at step 54, subject to the manner in which the DLL's make the data available. The reports are specific because they are based on objects in memory 31, having attributes that are stored in the database 32. Thus, if an object type "stress safety evaluation" is found, the script will define what should be said based on the attributes for the object. The script may be set up to act as a template to control what is reported based on the attributes of the object. Thereafter, the report may be handed back to the user at step 55.

The steps 48, 49, 50, 52, 54 and 55 are carried out on the server side 14 of the system 10. Software stored in an appropriate memory device is used to perform those steps. For example, some typical code to initialize the DSDBQuery object might look something like this:

```
Set Session("DSDB") =
Server.CreateObject("DSDBQuery.DSDBQuery.1")
Session("DSDB").OnInit "SolidWorks," "dsreport.dsdb"
Set Session("Drawings") = Session("DSDB").Drawings
Set Session("Drawing") = Session("Drawings")(1)
Set Session("Projects") = Session("Drawing").Projects
```

In the above examples, the initialization call is made to the DSDBQuery object through the OnInit( ) call with the first parameter specifying the CAD product in use and the second naming the desired database to open. The second parameter is optional and defaults to "dsreport.dsdb."

ASP code for exposing the data in the database 32 and preparing a natural language report therefrom is found in the following files appearing in Microfiche Appendix:
Common.asp (54 frames)
Contents.asp (frames 1–5)
Options.asp (frames 1–7)
Report.asp (frames 1–4)
Start.asp (frames 1–3)
TestASP.asp (frames 1–3)
Utilities.asp (frames 1–7)
VRMLGen.asp (frames 1–3)

It should be noted that the text of the resulting report is not necessarily an important feature of the present invention. It is anticipated that the present invention will be provided in a commercial embodiment with certain "canned" reports. The ASP script that controls the generation of the canned reports will be accessible to the user so that the reports can be customized. Rather than the ASP script that "writes" the report, the more important aspect of the invention is the ability, for the first time, to automatically generate a natural language report that interprets data in a FEA-type database. That is accomplished by querying the database to determine which objects are present, i.e. which objects have attributes, evaluating those objects according to a set of rules, which may be embodied in ASP script as in the preferred embodiment, and generating the report based on the results of the application of the rules. The rules may be based on artificial intelligence or expert systems concepts, or may be simple "if then" rules. The natural language report that is generated interprets the database on the basis of the applied rules.

The present invention uses the latest and some of the most powerful new technologies to generate in seconds what used to take days or months to do by hand. That time savings will result in significant savings and, at the same time, allow for the editing and archiving of the results of the engineering data. This new web-enabled design further promotes collaboration in the engineering and design worlds and improve the overall product development cycle.

While the present invention has been described in conjunction with preferred embodiments thereof, many modifications and variations will be apparent to those of ordinary skill in the art. The foregoing description and the following claims are intended to cover all such modifications and variations.

What is claimed is:

1. A method of generating a report from engineering data representing attributes of physical objects, comprising the steps of automatically:
    identifying attributes of physical objects stored in a database as engineering data;
    creating representations of said physical objects using said attributes;
    applying a set of interpretive rules to said representations of said physical objects, said interpretive rules representing a link between said engineering data and natural language text; and
    generating a report containing natural language text based on the application of the interpretive rules.

2. The method of claim 1 wherein said engineering data is generated using a CAD/CAE program, and wherein objects are stored in the database in a manner that mimics a hierarchy for the objects established by the CAD/CAE program.

3. The method of claim 1 additionally comprising the step of initially copying at least a portion of the database into a second database, and wherein the remaining steps of the method are carried out on the second data base.

4. The method of claim 1 wherein said step of applying a set of interpretive rules includes the step of applying an artificial intelligence rule set.

5. The method of claim 1 wherein said step of applying a set of interpretive rules includes the step of applying an expert system rule set.

6. A method of automatically generating a report from a database containing engineering data representing attributes of physical objects, comprising the steps of:
    requesting a file from a server;
    accessing the requested file;
    instantiating a component through a script in said file using said component to read attributes of physical objects stored in a database as engineering data;
    applying a set of interpretive rules to said attributes, said interpretive rules representing a native link between said engineering data and natural language text; and
    generating a report containing natural language text based on the application of the interpretive rules.

7. The method of claim 6 additionally comprising the step of initially copying at least a portion of said database into a second database after said accessing step, and wherein the remaining steps of said method are carried out with respect to said second database.

8. The method of claim 6 wherein said engineering data is generated using a CAD/CAE program, and wherein objects are stored in the database in a manner that mimics a hierarchy for the objects established by the CAD/CAE program.

9. The method of claim 6 wherein said step of requesting a file includes the step of requesting an HTML file locally with respect to said server.

10. The method of claim 6 wherein said step of requesting a file includes the step of requesting an HTML file remotely with respect to said server through a system.

11. The method of claim 6 wherein said generating step includes the step of generating a report in HTML.

12. The method of claim 6 wherein said generating step includes the step of generating a report in VRML.

13. A method of generating a report from a database containing engineering data representing attributes of physical objects in response to a request for a file, comprising the steps of automatically:
    accessing a requested file;
    creating a software process through a script in said requested file, said software process:
        identifying attributes of physical objects stored in a database as engineering data;
        creating representations of said physical objects using said attributes;
        applying a set of interpretive rules to said representations of said physical objects, said interpretive rules representing a native link between said engineering data and natural language text; and
        generating a report containing natural language text based on the application of the interpretive rules.

14. The method of claim 13 additionally comprising the step of initially copying at least a portion of said database into a second database after said accessing step, and wherein the remaining steps of said method are carried out with respect to said second database.

15. The method of claim 13 wherein said engineering data is generated using a CAD/CAE program, and wherein objects are stored in the database in a manner that mimics a hierarchy for the objects established by the CAD/CAE program.

16. The method of claim 13 wherein said generating step includes the step of generating a report in HTML.

17. The method of claim 13 wherein said generating step includes the step of generating a report in VRML.

18. A method of generating a report from engineering data representing physical objects, comprising the steps of automatically:

instantiating a component;

using said component to instantiate objects based on engineering data about said objects found in the database; and generating a natural language report based on the instantiated objects according to a set of interpretive rules representing a link between said engineering data and natural language.

19. The method of claim 18 wherein said step of instantiating a component includes the step of instantiating a DLL.

20. The method of claim 19 wherein said step of instantiating objects includes the step of instantiating a second DLL.

21. The method of claim 18 additionally comprising the step of initially copying at least a portion of the database into a second database, and wherein the steps of the method are carried out on the second database.

22. An apparatus for automatically generating a report from engineering data representing attributes of physical objects, comprising:

means for identifying attributes of physical objects stored in a database as engineering data;

means for creating representations of said physical objects using said attributes;

means for applying a set of interpretive rules to said representations of said physical objects, said interpretive rules representing a link between said engineering data and natural language text, and for automatically generating a report based on the application of the set of interpretive rules.

23. The apparatus of claim 22 additionally comprising means for storing a second database, said second database storing at least a portion of the same information which is found in said database.

24. A memory device carrying an ordered set of instructions which, when performed, execute a method comprised of the steps of:

identifying attributes of physical objects stored in a database as engineering data;

creating representations of said physical objects using said attributes;

applying a set of interpretive rules to said representations of said physical objects, said interpretive rules representing a link between said engineering data and natural language text; and generating a report containing natural language text based on the application of the interpretive rules.

25. An apparatus for automatically generating a report from engineering data representing physical objects, comprising:

means for instantiating a component;

means for using said component to instantiate objects based on engineering data about said objects found in the database; and means for generating a natural language report based on the instantiated objects according to a set of interpretive rules representing a link between said engineering data and natural language.

26. A memory device carrying an ordered set of instructions which, when performed, execute a method on engineering data representing physical objects, said method comprised of the steps of:

instantiating a component;

using said component to instantiate objects based on engineering data about said objects found in the database; and generating a natural language report based on the instantiated objects according to a set of interpretive rules representing a link between said engineering data and natural language.

27. A system, comprising:

a first computer having means for requesting a file from a server; and a server, comprising:
  means for storing the requested file;
  means for accessing the requested file;
  means for instantiating a component to read attributes of physical objects stored in a database as engineering data; and
  means for applying a set of interpretive rules to said attributes, said interpretive rules representing a native link between said engineering data and natural language text, and for generating a report containing natural language text based on the application of the interpretive rules;
  said means for requesting a file also receiving said generated report; and
  a system connecting said computer and said server.

28. The system of claim 27 wherein said means for requesting and for receiving includes a web browser.

* * * * *